United States Patent
Potasek

(10) Patent No.: US 9,878,904 B1
(45) Date of Patent: Jan. 30, 2018

(54) MEMS SENSOR WITH ELECTRONICS INTEGRATION

(71) Applicant: Rosemount Aerospace Inc., Burnsville, MN (US)

(72) Inventor: David P. Potasek, Lakeville, MN (US)

(73) Assignee: Rosemount Aerospace Inc., Burnsville, MN (US)

( * ) Notice: Subject to any disclaimer, the term of this patent is extended or adjusted under 35 U.S.C. 154(b) by 0 days.

(21) Appl. No.: 15/333,810

(22) Filed: Oct. 25, 2016

(51) Int. Cl.
  *B81C 3/00* (2006.01)
  *B81B 3/00* (2006.01)

(52) U.S. Cl.
  CPC ............ *B81C 3/001* (2013.01); *B81B 3/0021* (2013.01); *B81B 2201/0264* (2013.01); *B81B 2207/07* (2013.01); *B81C 2201/013* (2013.01); *B81C 2201/019* (2013.01); *B81C 2203/0172* (2013.01)

(58) Field of Classification Search
  CPC ............ B81C 3/001; B81C 2201/013; B81C 2201/019; B81C 2203/0172; B81B 3/0021; B81B 2201/0264; B81B 2207/07
  See application file for complete search history.

(56) References Cited

U.S. PATENT DOCUMENTS

| | | | | |
|---|---|---|---|---|
| 6,550,337 B1* | 4/2003 | Wagner | ................. | G01L 9/0042 73/715 |
| 6,938,490 B2* | 9/2005 | Wagner | ................. | G01L 9/0042 73/708 |
| 8,659,167 B1* | 2/2014 | Bowles | ................. | B81C 1/0023 257/777 |
| 8,878,313 B2 | 11/2014 | Salmaso | | |
| 2010/0230766 A1* | 9/2010 | Elian | ..................... | G01L 19/141 257/414 |
| 2013/0221457 A1* | 8/2013 | Conti | .................... | B81B 7/0061 257/416 |
| 2015/0274515 A1* | 10/2015 | Bowles | .................... | B81B 7/02 257/415 |
| 2015/0369684 A1 | 12/2015 | Nguyen et al. | | |
| 2016/0276310 A1* | 9/2016 | Rajoo | ................. | H01L 25/0657 |
| 2016/0295310 A1* | 10/2016 | Zoellin | ................. | H05K 1/181 |

FOREIGN PATENT DOCUMENTS

CN    102445301 A    5/2012

* cited by examiner

*Primary Examiner* — Latanya N Crawford
(74) *Attorney, Agent, or Firm* — Kinney & Lange, P.A.

(57) ABSTRACT

A MEMS device with electronics integration places integrated circuit components on a topping wafer of a sensing die to conserve space, minimize errors and reduce cost of the device as a whole. The topping wafer is bonded to a sensing wafer and secured in a housing.

16 Claims, 6 Drawing Sheets

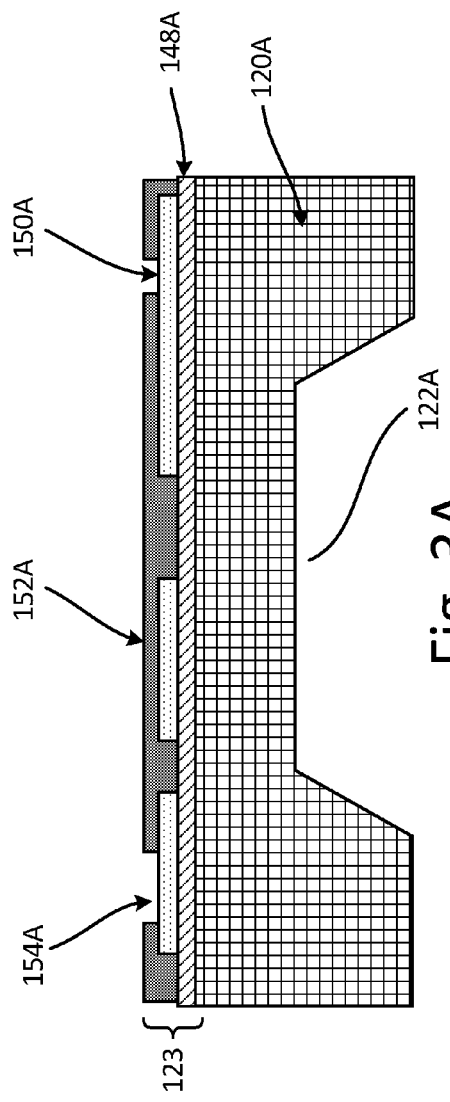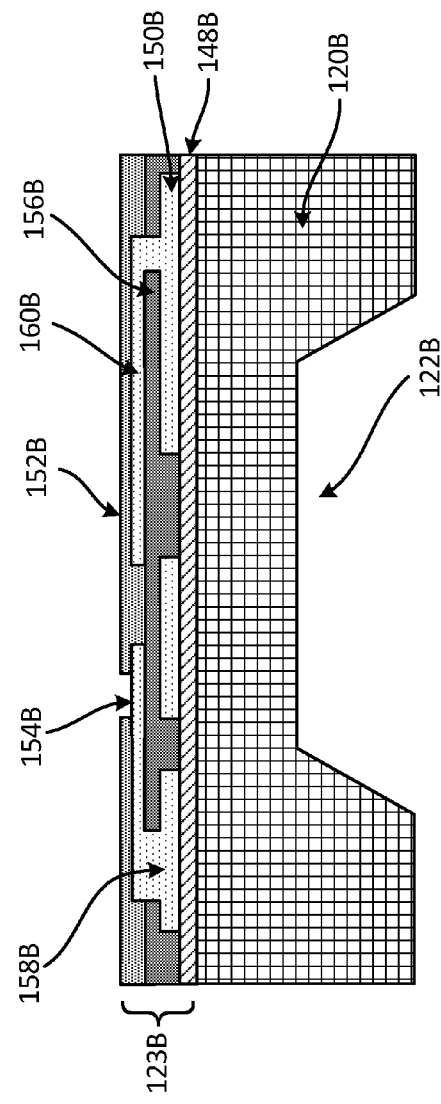

MEMS SENSOR WITH ELECTRONICS INTEGRATION

BACKGROUND

Microelectromechanical systems (MEMS) are small devices comprised of electrical and mechanical components, designed to work together to sense physical properties in their local environment. For instance, MEMS pressure sensors are designed to sense and report the pressure of a fluid or environment in which the pressure sensor resides. The pressure sensed by the MEMS pressure sensor, however, results in a very small signal that must be amplified to useable levels by electronic components.

Generally, electronics and MEMS components used in MEMS sensing devices are sensitive to errors caused by temperature change and stress. The temperature sensitivity of the electronics and MEMS components can be calibrated out by incorporating a temperature signal and correcting for temperature. However, there is a limit to how much can be calibrated out in a traditional MEMS package configuration, where the electronics are separated from the MEMS sensing die. The physical separation allows the electronics and MEMS sensing die to be at different temperatures such that the true compensation temperature is not known. This uncorrectable temperature difference is particularly high during transient conditions.

Some prior art embodiments place electronics on the same silicon chip on which the MEMS sensor is located. While this set up can provide overall smaller size of the device and higher performance, many MEMS processes are not compatible with complementary metal-oxide-semiconductor (CMOS) processing commonly used to create integrated electronic circuits. In this setup, overall yields of the devices decrease due to the combining of yield loss between the MEMS sensor and the electronics. Additionally, certain components, such as stabile high value resistors, are not easily incorporated into CMOS electronics, and the expense of running both MEMS and CMOS processes can be quite cost prohibitive.

SUMMARY

A microelectromechanical sensor device includes a backing wafer, a microelectromechanical sensing wafer attached to the backing wafer, a topping wafer anchored to the sensing wafer opposite the backing wafer, at least one integrated circuit component, the at least one integrated circuit component bonded to the topping wafer, and a housing, wherein the backing wafer is anchored to the housing.

A method of making a MEMS sensor includes processing a sensor wafer, processing a topping wafer, bonding the topping wafer to the sensing wafer, mounting the sensing die on a package base, attaching one or more integrated circuit components to the topping wafer, and wire bonding the one or more integrated circuit components to the sensing wafer.

BRIEF DESCRIPTION OF THE DRAWINGS

FIG. 3A is a cross-sectional view of a topping wafer in a MEMS sensor device with electronics integration.

FIG. 3B is a cross-sectional view of a topping wafer in a MEMS sensor device with electronics integration in a different embodiment with multiple metal trace layers.

DETAILED DESCRIPTION

The disclosed system integrates electronic components on to a topping wafer in the MEMS sensing die. Incorporating integrated circuit (IC) components and routing traces into a topping wafer allows integration of the electronics directly onto the MEMS sensor. This minimizes error due to proximity of IC components to the MEMS sensor by reducing changes in temperature and stress between the two. Moreover, as MEMS sensors and IC components are typically made of silicon substrates and in direct contact, they benefit from high thermal conductivity that quickly equilibrates temperatures. Also, since the MEMS sensor die and integrated IC components are made out of the same material there is no thermally induced stress due to differences in thermal expansion coefficients. Thus the IC components and MEMS sensor stay at nearly the same temperature at all times, even during thermal transient changes.

Figure 1:
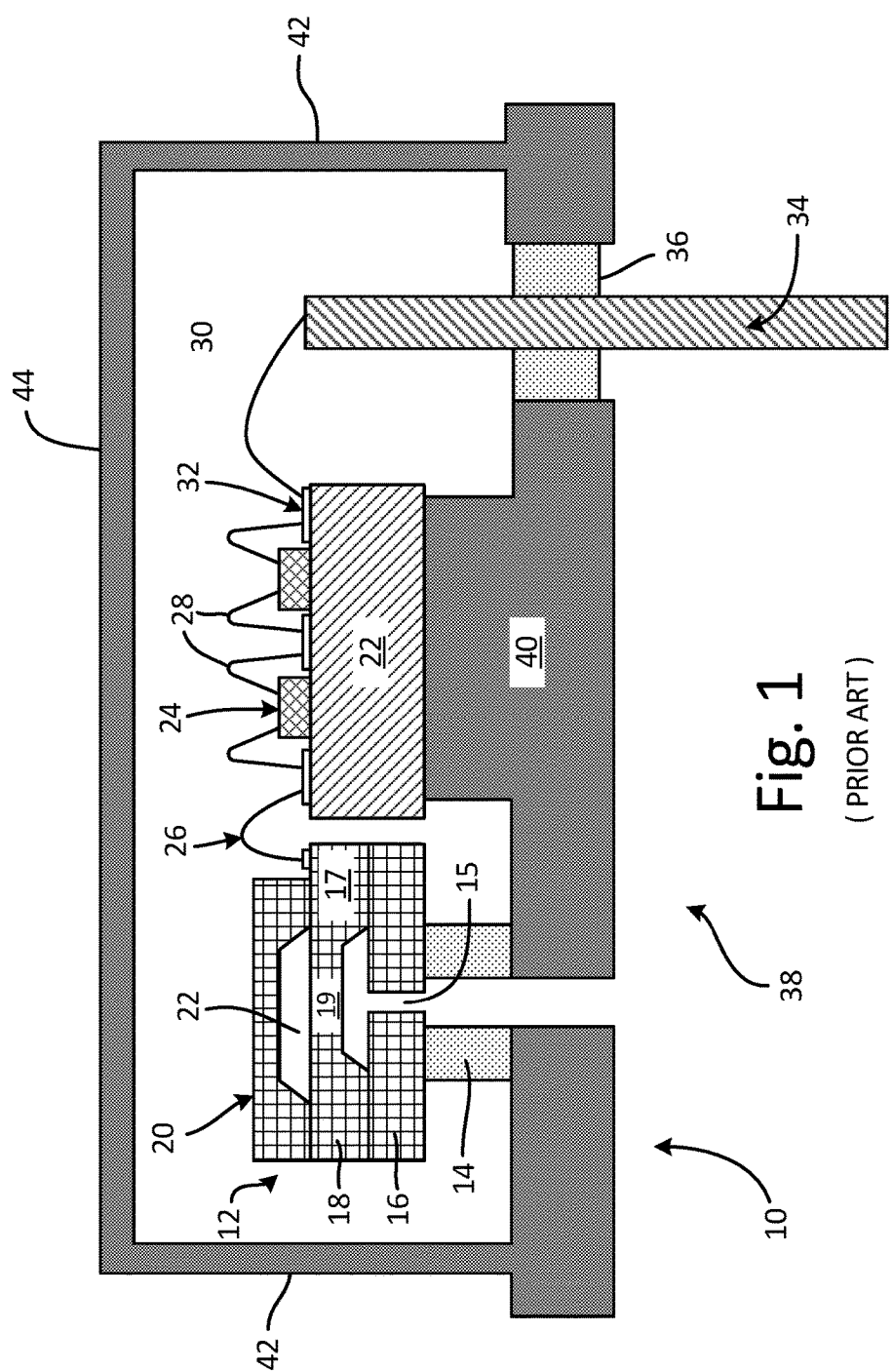
FIG. 1 is a schematic diagram of a prior art MEMS sensor device.

FIG. 1 is a schematic diagram of MEMS sensor device 10 as disclosed in the prior art. Prior art device 10 includes sensor die 12, and topping wafer 20; ceramic board 22; integrated circuit (IC) components 24; wire bonds 26, 28, 30; electrical routing 32; feedthrough pins 34; seal 36; and housing 38, which includes package bade 40, sidewalls 42, and back plate 44.

In MEMS sensor device 10, sensor die 12 detects pressure of an external environment, which can be a fluid or gas. Die 12 includes pedestal 14, backing wafer 16, sensing wafer 18, and topping wafer 20. Pedestal 14 can be glass, silicon, or another suitable material. Pedestal 14 is anchored to package base 40 of housing 38. Pedestal 14 provides a path for a fluid of interest to interact with sensing wafer 18, but prevents stress and damage from thermal stresses in package base 40 from reaching sensing wafer 18.

Backing wafer 16 connects pedestal 14 and sensing wafer 18, and further protects sensing wafer 18 from package base 40. Backing wafer 16 can be made of silicon, and is bonded to sensing wafer 18 through normal means such as fusion bonding, frit bonding, eutectic bonding, anodic bonding, or other appropriate methods. Passage 15 in the center of backing wafer 16 allows fluid flow to sensing wafer 18, but is strong enough to prevent any stress transmitted through pedestal 14 from affecting sensing wafer 18.

Sensing wafer 18, which is made of silicon, contains support portion 17 and sensing portion 19. Sensing portion 19, located in the center of sensing wafer 18, houses a diaphragm. When fluid flows from the external environment through pedestal 14 and backing wafer 16 to sensing wafer 18, it deflects the diaphragm of sensing wafer 18. When the diaphragm is deflected, sensing wafer 18 detects pressure of the external fluid compared to a vacuum or reference pressure determined by topping wafer 20. Sensing wafer 18 sends a pressure signal to IC components 24 through wire bonds 26.

Topping wafer 20 is typically made of silicon, and is secured on top of sensing wafer 18. Topping wafer 20 provides a reference pressure to sensing wafer 18 based on recess 22 in topping wafer 20. Recess 22 can be a vacuum or provide a different reference pressure. Topping wafer 20 also prevents sensing wafer 18 from rupturing, by providing travel stop and limiting the maximum deflection of the diaphragm.

Sensor die 12 is connected to IC components 24 by wire bonds 26 and electrical routing 32. Wire bonds 26 send an electrical signal from sensing wafer 18 to IC components 24. In this embodiment, IC components 24 are located on ceramic board 22. Ceramic board 22 is secured to package base 40 of housing 38.

Electrical routing 32 is secured on ceramic board 22. Electrical routing 32 is connected to IC components by wire bonds 28, and connected to feedthrough pins 34 by wire bonds 30. Electrical feedthrough pins 34 run through package base 40 of housing 38 to an external receiver (not pictured). Electrical feedthrough pins 34 are sealed to housing 38 by seal 36.

The pressure signal from sensing wafer 18 travels to ceramic board 22 through wire bonds 26. There, the signal is run through electrical routing 32 and IC components 24 through wire bonds 28. The signal is amplified by IC components 24 until it is useable, and then routed through wire bonds 30 to electrical feedthrough pins 34, where the signal is routed outside of housing 38 and device 10 for other use or analysis. One of the many IC components 24 can be a temperature detector used to calibrate the device to correct for temperature errors.

In this prior art embodiment, sensor die 12 and IC components 24 are separated. IC components 24 and electrical routing 32 are mounted on ceramic board 22. For this reason, housing 38 is very large, and sidewalls 42, package base 40 and back plate 44 must encompass both sensor die 12 and ceramic board 22. The separation of sensor die 12 and IC components 24 also causes an increase in errors due to thermal stresses and temperature mismatches caused by distance.

Figure 2A:
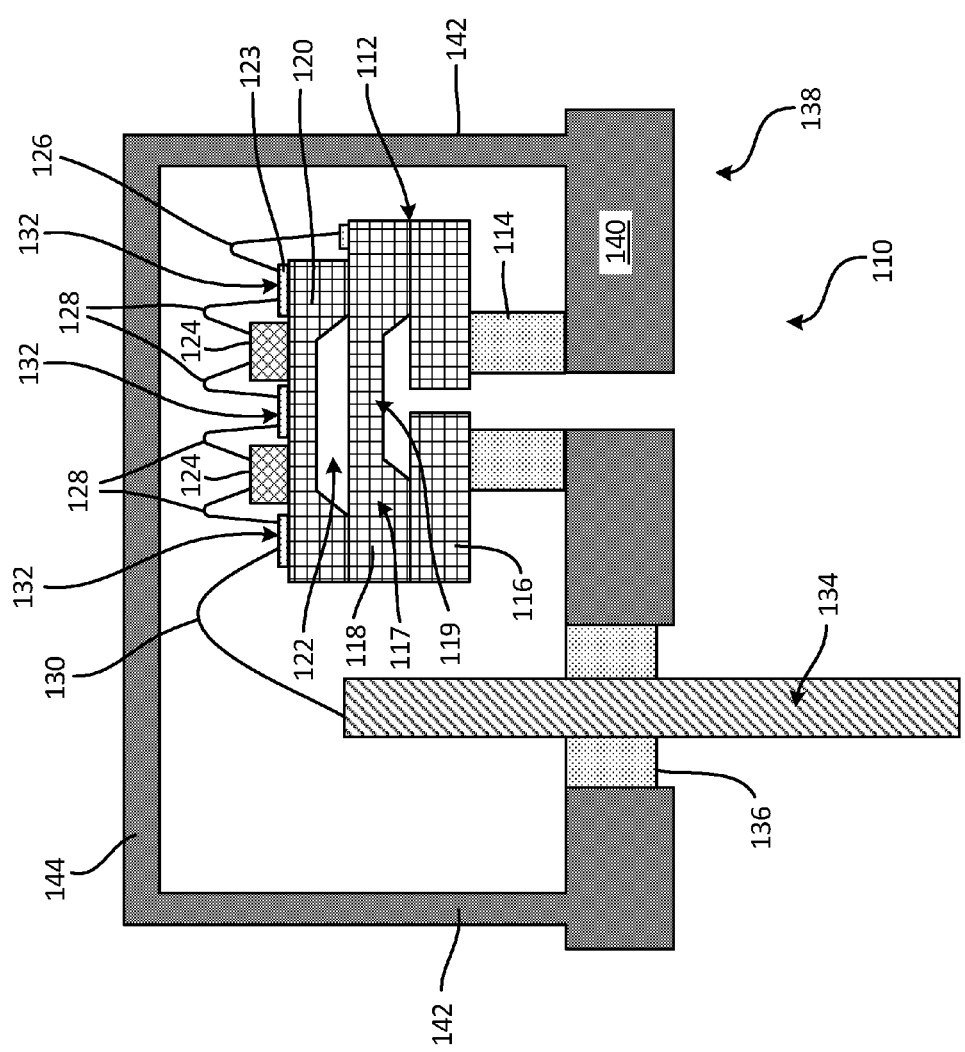
FIG. 2A is a schematic diagram of a MEMS sensor device with electronics integration.

FIG. 2A is a schematic diagram of MEMS sensor device 110 with electronics integration that minimizes the errors associated with the prior art embodiment shown in FIG. 1. Device 110 includes sensor die 112, and topping wafer 120; integrated circuit (IC) components 124; wire bonds 126, 128, 130; electrical routing 132; feedthrough pins 134; seal 136; and housing 138, which includes package base 140, sidewalls 142, and back plate 144.

Sensing die 112 is designed to detect pressure of an external environment. Typically, the external environment is a fluid (either liquid or gas). Sensing die 112 includes pedestal 114, backing wafer 116, sensing wafer 118, and topping wafer 120.

Pedestal 114 is open to the external environment, and separates sensing wafer 118 from foreign object or pressure damage that could occur if sensing wafer 118 was directly exposed to the external environment. Pedestal 114 contains a passage allowing exposure of some fluid from the external environment to sensing wafer 118, and both insulates and isolates sensing wafer 118. Pedestal 114 can be glass, silicon, or other suitable materials. Pedestal 114 is mounted on package base 140 of housing 138.

Backing wafer 116 is mounted on pedestal 114, and further separates sensing wafer 118 from package base 140. Backing wafer 116 can be made of silicon. Backing wafer 116 contains a narrow passage to allow fluid flow to sensing wafer 118 but prevent foreign object damage to sensing wafer 118.

Sensing wafer 118 is designed to measure pressure of the external environment. Sensing wafer 118 includes support portions 117 and sensing portion 119. Support portions 117 are bonded to backing wafer 116 and prevent disruption of sensing portion 119. Sensing portion 119 can be a piezo resistive or capacitive pressure sensor, and contains a diaphragm. The diaphragm is deflected when fluid from the external environment travels through pedestal 114 and backing wafer 116 to sensing wafer 118. The diaphragm in sensing portion 119 is deflected relative to the pressure of the fluid from the external environment. Sensing portion 119 of sensing wafer 118 sends a signal proportional to the pressure sensed along wire bond 126 to be analyzed.

Topping wafer 120 is bonded to a side of sensing wafer 118 opposite backing wafer 116. Topping wafer 120 can be made of silicon. Topping wafer 120 contains recess portion 122 that is centered over sensing portion 119 of sensing wafer 118. Recess portion 122 provides a reference pressure to sensing wafer 118. The reference pressure can be a vacuum, atmospheric pressure, or other appropriate reference pressure.

In this embodiment, topping wafer 120 replaces a ceramic circuit board. Instead, electrical components are bonded to a top side (opposite sensing wafer 118) of topping wafer 120. This is accomplished by layering dielectric materials and metal traces on top of topping wafer 120 in connection layer 123. Connection layer 123 is more fully discussed in reference to FIGS. 3A, 3B and 4.

Electrical routing 132 is bonded to connection layer 123 of topping wafer 120 to create electrical connections for IC components 124. Electrical routing 132 can be any conductive metal traces. IC components 124 can contain any number of required components, such as transistors, diodes, resistors, or capacitors, and are typically made of silicon. IC components 24 can also contain die level passive components, such as precision resistor chips or capacitor chips. IC components 24 can contain application specific integrated circuits (ASICs) or general purpose integrated circuits. Electrical routing 132 receives a signal from sensing wafer 118 through wire bond 126, which is then passed to IC components 124 through wire bonds 128. The signal is amplified by IC components 124 until it is at a useable level, at which point it is sent through wire bond 130 to feedthrough pins 134.

By incorporating electrical routing 132 into connection layer 123 of topping wafer 120, IC components 124 can be incorporated directly on to sensing die 112 of device 110, and no additional circuit board (for example, ceramic board 22) is needed within housing 138. Because electrical routing 132 and IC components 124 are in the same location as sensor die 112, thermal differences between the two are minimized. Moreover, because sensor die 112 and IC components 124 are typically both made of silicon, and are in direct contact with each other, they benefit from high thermal conductivity that quickly equilibrates temperatures. Also, because MEMS sensor die 112 and IC components 124 are made out of the same material, there is no thermal coefficient of expansion mismatch, resulting in no thermal strain. This configuration also minimizes the space required, as no ceramic circuit board needs to be mounted to housing 138.

Once the signal is sent to feedthrough pins 134, it is then sent out of housing 138 to an external receiver (not pictured), where the data can be used or analyzed. Feedthrough pins 134 can be a singular or multiple feedthrough pins, and can be constructed with plated Kovar. Feedthrough pins 134 are sealed to package base 140 of housing 138 by seal 136 to prevent leak of fluid from the external environment into housing 138 around feedthrough pins 134. Typically, seal 136 is a hermetic seal.

Housing 138 encloses sensing die 112 and IC components 124. Housing 138 includes package base 140, sidewalls 142, and back plate 144. Housing 138 is generally made of steel, nickel, Kovar, or other appropriate plastics, ceramics, metals or alloys. Pedestal 114 is anchored to package base 140, and feedthrough pins runs through package base 140, sealed by hermetic seal 136. Sidewalls 142 and back plate 144 are welded to package base 140 to enclose device 110.

This embodiment of a pressure sensor allows for a smaller overall size of device 110, which is both cost-effective and saves resources. Moreover, this set up minimizes errors in the signal that can occur in IC components due to distance and temperature fluctuations between sensing die 112 and IC components 124. This concept can also be applied to other MEMS devices.

Figure 2B:
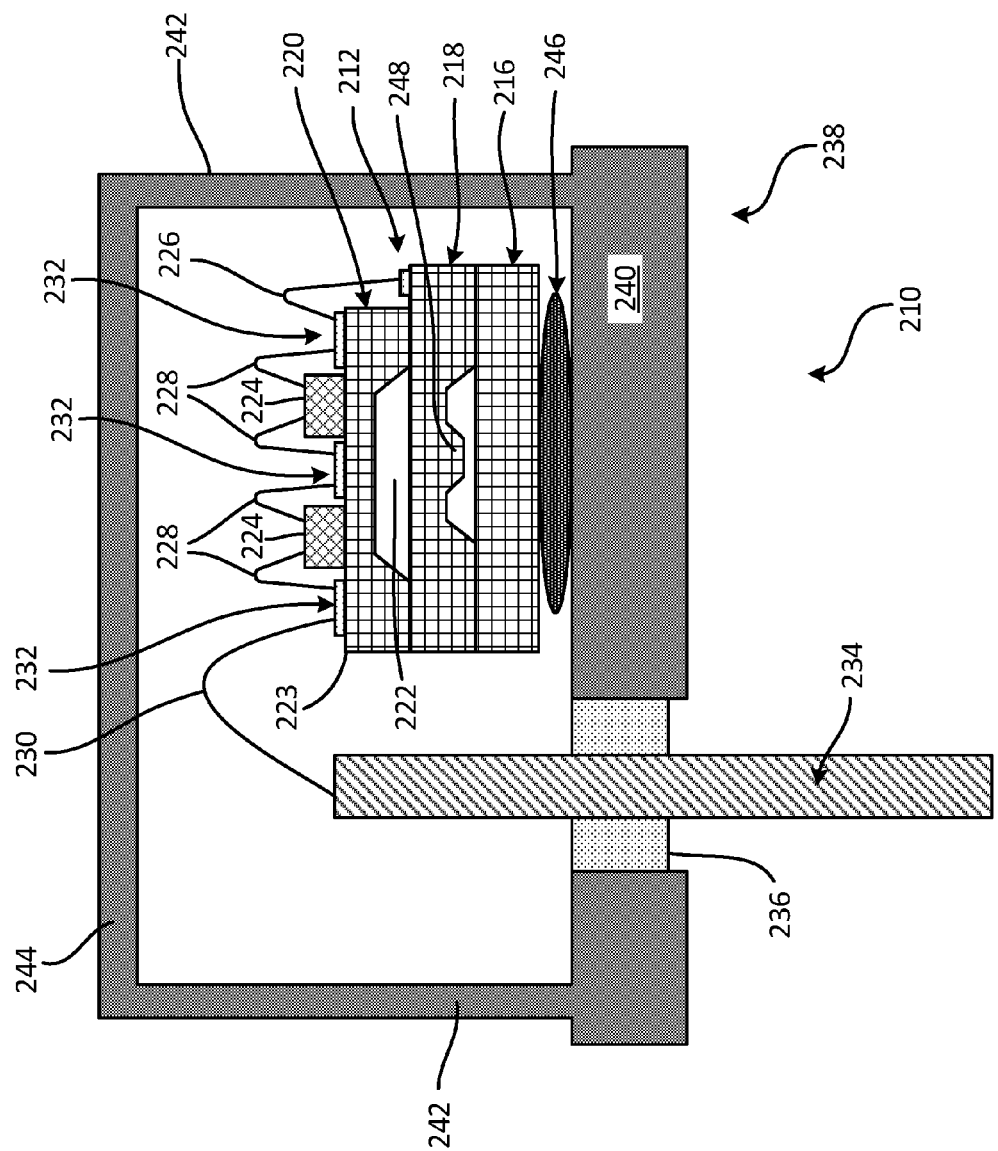
FIG. 2B is a schematic diagram of an inertial device with electronics integration.

For instance, FIG. 2B is a schematic diagram of inertial device 210 with electronics integration. Device 210 includes sensor die 212, which includes die attach material 246, backing wafer 216, sensing wafer 218 with proof mass portion 248, and topping wafer 220; integrated circuit (IC) components 224; wire bonds 226, 228, 230; electrical routing 232; feedthrough pins 234; seal 236; and housing 238, which includes package base 240, sidewalls 242, and back plate 244.

Inertial device 210 is set up similarly to pressure sensor device 110. The main components, unless otherwise described, are the same and are connected in the same fashion. Inertial device 210 can be an accelerometer, a gyroscope, or other MEMS inertial device configured to detect inertia.

In inertial device 210, die attach material 246 replaces pedestal 114. Die attach material 246 secures sensing die 212 to housing 238, and can be an epoxy, solder or eutectic material. Die attach material 246 is anchored to package base 240 of housing 238. Backing wafer 216 is attached to die attach material 246.

Backing wafer 216 anchors sensing wafer 218. Backing wafer 216 and sensing wafer 218 can both be made of silicon, but sensing wafer 218 is the active MEMS wafer. Unlike sensing wafer 118 in device 110, sensing wafer 218 here has proof mass portion 248 for inertial reference.

Topping wafer 220, which can also be made of silicon, is anchored to sensing wafer 218. Similar to topping wafer 120 in FIG. 2A, topping wafer 220 serves as a circuit board base for IC components 224 and electrical routing 232. Topping wafer 220 provides a reference vacuum to sensing wafer 218, or topping wafer 220 can provide a damping pressure in recess 222 in topping wafer 220. Recess 222 can be a vacuum or provide a reference pressure to properly dampen inertial device 210. Electrical components are bonded to a top side (opposite sensing wafer 218) of topping wafer 220. This is accomplished by layering dielectric materials and metal traces on top of topping wafer 220 in connection layer 223. Connection layer 223 is more fully discussed in reference to FIGS. 3A, 3B and 4 (referred to as connection layer 123A, 123B). As described above, the placement of IC components 224 on topping wafer 220 has a number of benefits, including decreased signal error and smaller overall size.

FIG. 3A is a cross-sectional view of topping wafer 120A in MEMS sensor device 110 with electronics integration. In this embodiment, topping wafer 120A includes recess 122A, and connection layer 123A, which includes bottom dielectric layer 148A, metal trace layer 150A, top dielectric layer 152A, and top dielectric layer openings 154A.

Topping wafer 120A is similar to topping wafers 120 and 220 in FIGS. 2A and 2B. Topping wafer 120A can be made of silicon, and is anchored to a sensing wafer, such as 118 or 218. Recess 122A in topping wafer 120A can be centered over sensing portion 119 of sensing wafer 118 to avoid constraining sensing portion 119. This decouples active sensing portion 119 of sensing wafer 118 from IC components 124, but still provides high thermal continuity.

Topping wafer 120A is covered by a connection layer that includes layers of dielectric material and metal traces. In FIG. 3A, connection layer 123A includes bottom dielectric layer 148A, metal trace layer 150A, and top dielectric layer 152A. Dielectric layers 148A and 152A are thin film deposited insulators such as silicon dioxide or silicon nitride. Bottom dielectric layer 148A acts as an insulating isolator on a top surface of topping wafer 120A, similar to ceramic board 22 of FIG. 1. If topping wafer 120A is made out of an insulating material, dielectric layer 148A is unnecessary.

Metal trace layer 150A creates electrical connections above the top surface of topping wafer 120A. These electrical connections are accessible by IC components 124 through openings 154A in top dielectric layer 152A. Top dielectric layer 152A acts as a passivation layer to prevent IC components 124 from shorting. Openings 154A selectively allow electrical connections above the top surface of topping wafer 120A.

FIG. 3B is a cross-sectional view of topping wafer 120B in MEMS sensor device 110 with electronics integration in a different embodiment. In this embodiment, topping wafer 120B includes recess 122B, and connection layer 123B, which includes bottom dielectric layer 148B, first metal trace layer 150B, intermediate dielectric layer 156B, intermediate dielectric layer openings 158B, second metal trace layer 160B, top dielectric layer 152B, and top dielectric layer openings 154B.

Topping wafer 120B is similar to topping wafer 120A of FIG. 3A, but has additional layers in connection layer 123B based on the needs of the device. Connection layer 123B includes all the components of connection layer 123A, and additionally contains intermediate dielectric layer 156B and second metal trace layer 160B. In this embodiment, openings 158B are made in intermediate dielectric layer 156B. Openings 158B are filled with metal trace layer 160B, to allow connection of first metal trace layer 150B with second metal trace layer 160B. Openings 154B in top dielectric layer 152B allow metal trace layers 150B, 160B to electrically connect with IC components 124 or other items on the top surface of connection layer 123B.

Figure 4:
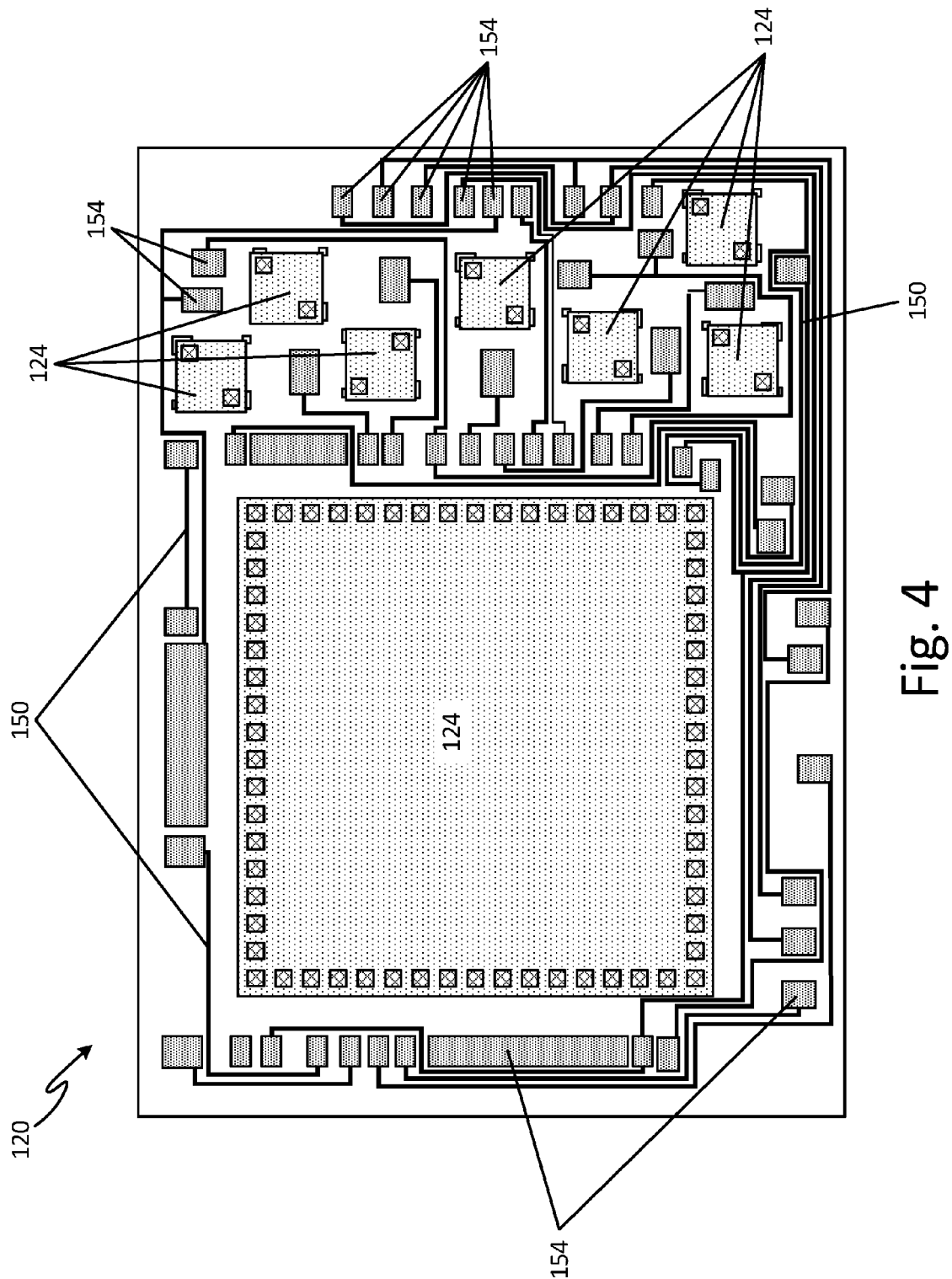
FIG. 4 is a top-down view of a topping wafer in a MEMS sensor device with electronics integration.

FIG. 4 is a top-down view of topping wafer 120 in MEMS sensor device 110 with electronics integration. Topping wafer 120 includes IC components 124, metal traces 150, 160 and top dielectric layer openings 154.

Topping wafer 120 serves as a platform for a circuit board-like set up including IC components 124, metal traces 150, 160, and dielectric layer openings 154. IC components 124 are wire bonded with metal traces 150, 160 through openings 154. This creates a circuit that can receive an incoming signal from sensing wafer 118 via wire bond 126, 226, amplify the signal, and send it out through feedthrough pins 134 to external electronics for further use or analysis.

Figure 5:
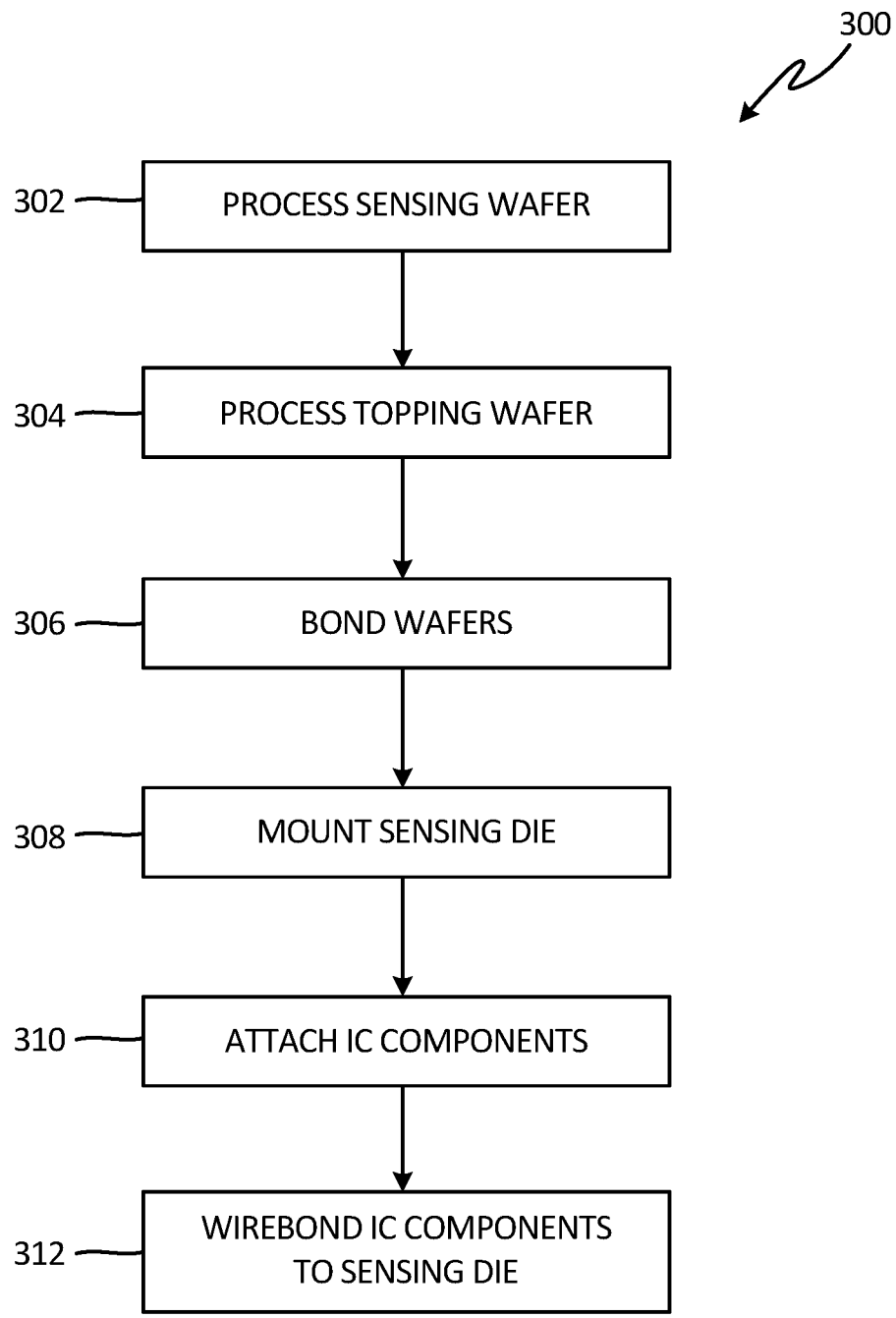
FIG. 5 is a flow chart depicting a method of making a MEMS sensor device with electronics integration.

FIG. 5 is a flow chart depicting method 300 of making a MEMS sensor device with electronics integration. Method 300 begins with processing a sensing wafer in step 302. The sensing wafer can be silicon, or alternatively Pyrex, glass, quartz, or other appropriate materials. The sensing wafer can include a sensing portion, such as a diaphragm, and a structural portion.

Next, in step 304, a topping wafer is processed. The topping wafer can be silicon. Once a silicon body of the topping wafer is formed, electrical routes can be created on a side of the topping wafer. This includes bonding a first dielectric layer on to a side of the topping wafer, then depositing a metal trace layer on top of the first dielectric layer. Next, a second dielectric layer is bonded to the metal trace layer. Finally, openings are created in the second dielectric layer to allow electrical connection to the metal trace layer. Finally, a recess is etched into the topping wafer opposite the side with electrical routes. This can be done through potassium hydroxide wet etch methods, or deep reactive ion etching DRIE methods. Step 304 can include additional steps, such as adding a second metal trace layer and a third dielectric layer.

In step 306, the sensing wafer and the topping wafer are bonded together. They can be processed individually, or in a batch, through commercially available methods. A backing wafer and pedestal can optionally be included. The backing wafer can be made of silicon, while the pedestal can be made of an insulating material. The topping wafer, sensing wafer, backing wafer and pedestal can be bonded together simultaneously or individually. The backing wafer is anchored to the pedestal, and the sensing wafer is bonded to a side of the backing wafer opposite the pedestal. The topping wafer is bonded to a side of the sensing wafer opposite the backing wafer. At this point, if the sensor dies are being processed as a batch, they can be cut into individual sensor dies.

Next, in step 308, the sensing die is mounted on a package base. The package base is typically steel, nickel, Kovar, or another metallic substance used for housing a MEMS device. Generally, the pedestal or backing wafer is mounted directly on the package base through a solder preform.

Next, in step 310, integrated circuit (IC) components are attached to the topping wafer. IC components are then wire bonded to metal traces accessible through the openings in the top dielectric layer. In step 312, the IC components are wire bonded to the sensing wafer in order to receive signals sent by the sensing wafer. Also in step 312, the IC components can be wire bonded to one or more electrical feedthrough pins. The feedthrough pins can be run through the package base, and sealed with hermetic seals. In the end, the sensor die and IC components are enclosed in a housing by welding the package base to sidewalls and a back plate. Thus, the sensor die is protected from an external environment.

The proposed MEMS device with electronics integration places IC components on a topping wafer of a sensing die to conserve space, minimize errors and reduce cost of the device as a whole. The proposed device reduces the need for ceramic routing boards and lowers the complexity and size of the total device, while allowing the device to provide high performance. Thermal differences between the MEMS sensor die and the IC components are minimized, reducing errors associated with in thermal transient conditions. Moreover, the topping wafer decouples the active MEMS sensor region from the IC components while providing a high thermal continuity.

Discussion of Possible Embodiments

The following are non-exclusive descriptions of possible embodiments of the present invention.

A microelectromechanical sensor device includes a backing wafer, a microelectromechanical sensing wafer attached to the backing wafer, a topping wafer anchored to the sensing wafer opposite the backing wafer, at least one integrated circuit component, the at least one integrated circuit component bonded to the topping wafer, and a housing, wherein the backing wafer is anchored to the housing.

The device of the preceding paragraph can optionally include, additionally and/or alternatively, any one or more of the following features, configurations and/or additional components:

The device includes a pedestal exposed to an external environment, the backing wafer secured to the pedestal.

The pedestal is anchored to the housing.

The device includes one or more wire bonds connecting the at least one integrated circuit component to the sensing wafer.

The device includes at least one feedthrough pin connected to the at least one integrated circuit component through a wire bond.

The at least one feedthrough pin passes through the housing and wherein the at least one feedthrough pin connects to external electronics.

The housing includes a package base, one or more side walls, and a back plate.

The sensing wafer includes a support region and a sensing region.

The topping wafer contains a recess, the recess positioned over the sensing region of the sensing wafer.

A connection layer is attached to the topping wafer, the connection layer comprising: a first dielectric layer attached to a surface of the topping wafer opposite the sensing wafer, a first metal trace layer, the first metal trace layer attached to the first dielectric layer opposite the topping wafer, and a second dielectric layer, the second dielectric layer attached to the first metal trace layer opposite the first dielectric layer.

The second dielectric layer contains one or more openings.

The connection layer further comprises a second metal trace layer connected to the second dielectric layer opposite the first metal trace layer, and a third dielectric layer connected to the second metal trace layer opposite the second dielectric layer.

The third dielectric layer contains one or more openings.

A method of making a MEMS sensor includes processing a sensor wafer, processing a topping wafer, bonding the topping wafer to the sensing wafer, mounting the sensing die on a package base, attaching one or more integrated circuit components to the topping wafer, and wire bonding the one or more integrated circuit components to the sensing wafer.

The method of the preceding paragraph can optionally include, additionally and/or alternatively, any one or more of the following features, configurations and/or additional components:

The method includes bonding a backing wafer to the sensing wafer.

The method includes bonding a pedestal to the backing wafer and bonding the pedestal to a package base.

The method includes wire bonding the one or more integrated circuit components to a feedthrough pin and running the feedthrough pin through an opening in the package base and sealing the opening.

Processing the topping wafer includes bonding a first dielectric layer on to a side of the topping wafer, depositing a first metal trace layer on to the first dielectric layer opposite the topping wafer, bonding a second dielectric layer on to the first metal trace layer opposite the first dielectric layer, and creating openings in the second dielectric layer such that the first metal trace layer is reachable through the second dielectric layer.

Processing the topping wafer includes etching a recess into a side of the topping wafer.

Processing the topping wafer includes depositing a second metal trace layer on to the second dielectric layer opposite the first metal trace layer, bonding a third dielectric layer on to the second metal trace layer opposite the second dielectric layer, and creating openings in the third dielectric layer such that the second metal trace layer is reachable through the third dielectric layer.

While the invention has been described with reference to an exemplary embodiment(s), it will be understood by those skilled in the art that various changes can be made and equivalents can be substituted for elements thereof without departing from the scope of the invention. In addition, many modifications can be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A microelectromechanical sensor device comprising:
   a backing wafer;
   a sensing wafer attached to the backing wafer;
   a topping wafer attached to the sensing wafer opposite the backing wafer;
   a connection layer attached on a surface of the topping wafer opposite the sensing wafer, the connection layer comprising:
      a first dielectric layer attached to the surface of the topping wafer opposite the sensing wafer;
      a first metal trace layer attached to the first dielectric layer opposite the topping wafer; and
      a second dielectric layer attached to the first metal trace layer opposite the first dielectric layer, wherein the second dielectric layer contains one or more openings configured to provide electrical connection;
   at least one integrated circuit component, the at least one integrated circuit component bonded to the connection layer and electrically connected to the first metal trace layer;
   one or more bonds connecting the at least one integrated circuit component to the sensing wafer; and
   a housing, wherein the backing wafer is attached to the housing.

2. The device of claim 1, further comprising a pedestal exposed to an external environment, the backing wafer secured to the pedestal.

3. The device of claim 2, wherein the pedestal is attached to the housing.

4. The device of claim 1, further comprising at least one feedthrough pin connected to the at least one integrated circuit component through a wire bond.

5. The device of claim 4, wherein the at least one feedthrough pin passes through the housing, and wherein the at least one feedthrough pin connects to external electronics.

6. The device of claim 1, wherein the housing comprises a package base, one or more side walls, and a back plate.

7. The device of claim 1, wherein the sensing wafer comprises a support region and a sensing region.

8. The device of claim 7, wherein the topping wafer contains a recess, the recess positioned over the sensing region of the sensing wafer.

9. A microelectromechanical sensor device comprising:
   a backing wafer;
   a sensing wafer attached to the backing wafer;
   a topping wafer attached to the sensing wafer opposite the backing wafer;
   a connection layer attached on a surface of the topping wafer opposite the sensing wafer, the connection layer comprising:
      a first dielectric layer attached to the surface of the topping wafer opposite the sensing wafer;
      a first metal trace layer attached to the first dielectric layer opposite the topping wafer; and
      a second dielectric layer attached to the first metal trace layer opposite the first dielectric layer, wherein the second dielectric layer contains one or more openings configured to provide electrical connection;
      a second metal trace layer connected to the second dielectric layer opposite the first metal trace layer; and
      a third dielectric layer connected to the second metal trace layer opposite the second dielectric layer; and
   at least one integrated circuit component, the at least one integrated circuit component bonded to the connection layer and electrically connected to at least one of the first and second metal trace layers;
   one or more bonds connecting the at least one integrated circuit component to the sensing wafer; and
   a housing, wherein the backing wafer is attached to the housing.

10. The device of claim 9, wherein the third dielectric layer contains one or more openings.

11. A method of making a MEMS sensor comprising:
    processing a sensor wafer;
    processing a topping wafer;
    bonding the topping wafer to the sensing wafer;
    mounting the sensing wafer on a package base;
    attaching one or more integrated circuit components to the topping wafer;
    wire bonding the one or more integrated circuit components to the sensing wafer such that the one or more integrated circuit components are electrically connected to the sensing wafer; and
    wire bonding the one or more integrated circuit components to a feedthrough pin and running the feedthrough pin through an opening in the package base and sealing the opening.

12. The method of claim 11, further comprising bonding a backing wafer to the sensing wafer.

13. The method of claim 11, further comprising bonding a pedestal to the backing wafer and bonding the pedestal to a package base.

14. The method of claim 11, wherein processing the topping wafer comprises:
    bonding a first dielectric layer on to a side of the topping wafer;
    depositing a first metal trace layer on to the first dielectric layer opposite the topping wafer;
    bonding a second dielectric layer on to the first metal trace layer opposite the first dielectric layer; and
    creating openings in the second dielectric layer such that the first metal trace layer is reachable through the second dielectric layer.

15. The method of claim 11, wherein processing the topping wafer comprises etching a recess into a side of the topping wafer.

16. The method of claim 14, wherein processing the topping wafer further comprises:
   depositing a second metal trace layer on to the second dielectric layer opposite the first metal trace layer;
   bonding a third dielectric layer on to the second metal trace layer opposite the second dielectric layer; and
   creating openings in the third dielectric layer such that the second metal trace layer is reachable through the third dielectric layer.

\* \* \* \* \*